United States Patent [19]
Shamouilian et al.

[11] Patent Number: 5,606,485
[45] Date of Patent: Feb. 25, 1997

[54] ELECTROSTATIC CHUCK HAVING IMPROVED EROSION RESISTANCE

[75] Inventors: Shamouil Shamouilian, San Jose; John F. Cameron, Los Altos, both of Calif.

[73] Assignee: Applied Materials, Inc., Santa Clara, Calif.

[21] Appl. No.: 276,735

[22] Filed: Jul. 18, 1994

[51] Int. Cl.$^6$ .................................................. H02N 13/00
[52] U.S. Cl. ........................................................ 361/234
[58] Field of Search ............................ 361/234; 279/128

[56] References Cited

U.S. PATENT DOCUMENTS

| | | |
|---|---|---|
| 4,184,188 | 1/1980 | Briglia . |
| 4,384,918 | 5/1983 | Abe . |
| 4,399,016 | 8/1983 | Tsukada et al. . |
| 4,645,218 | 2/1987 | Ooshio et al. ............... 361/234 X |
| 4,724,510 | 2/1988 | Wicker et al. ............... 361/234 |
| 4,771,730 | 9/1988 | Tezuka . |
| 5,275,683 | 1/1994 | Arami et al. . |

FOREIGN PATENT DOCUMENTS

| | | |
|---|---|---|
| 0171011 | 2/1986 | European Pat. Off. . |
| 1-298721 | 12/1989 | Japan . |
| 2-27748 | 1/1990 | Japan . |

OTHER PUBLICATIONS

Communication, Application No. 95304778.4, dated Oct. 26, 1995, from EPO.
Patent Application Ser. No. 08052018 filed Apr. 22, 1993.
Klein, Allen J., "Curing Techniques for Composites," *Advanced Composites*, Mar./Apr. 1988, pp. 32–44.
"Data Sheet—Breathers and Bleeders," Data Sheet from Airtech International, Inc., Carson, California (1993).
"Kapton General Information," Technical Brochure from DuPont de Nemours Company, Wilmington, Delaware (1993).
"R/flex® 1100 High Temperature Materials," Data Sheet DS20903D, Rogers Corporation, Chandler, Arizona (1993).
U.S. Patent Application entitled, "An Electrostatic Chuck Having a Grooved Surface," by Roger J. Steger, filed Jul. 20, 1993 (Applied Materials Docket 260).
U.S. Patent Application entitled, "Electrostatic Chuck with Erosion-Resistant Electrode Connection", no date provided.
U.S. Patent Application entitled, "Erosion Resistant Electrostatic Chuck", no date provided.

*Primary Examiner*—Fritz Fleming
*Attorney, Agent, or Firm*—Ashok K. Janah; James C. Wilson

[57] ABSTRACT

An electrostatic chuck having reduced erosion in erosive process environments is described. The electrostatic chuck comprises an insulator with (i) an electrode therein, (ii) a central portion overlying the electrode, and adapted to support a substrate thereon, and (iii) a peripheral portion extending beyond the electrode. In one version of the invention, the central portion of the insulator is raised relative to the lower peripheral portion of the insulator, thereby defining a step having a height H, which is maintained at less than about 10 microns, to reduce erosion of the insulator. In another version of the chuck, the peripheral portion of the insulator extends beyond the electrode and has a width W, which is maintained at at least about 2 mm to reduce erosion of the insulator.

15 Claims, 6 Drawing Sheets

Fig. 5

ELECTROSTATIC CHUCK HAVING IMPROVED EROSION RESISTANCE

BACKGROUND

This invention relates to an electrostatic chuck having improved erosion resistance for holding a substrate in a process chamber.

In semiconductor fabrication processes, electrostatic chucks are used to hold substrates, such as silicon wafers, during processing of the substrate. A typical electrostatic chuck comprises a base adapted to be secured to a support in a process chamber. An insulator with an electrode therein is on the base. An electrical connector electrically connects the electrode in the insulator to a voltage supply source. Electrostatic chucks are generally described in, for example, U.S. Pat. No. 4,184,188, to Briglia; U.S. Pat. No. 4,399,016, to Tokuda; U.S. Pat. No. 4,384,918, to Abe; and U.S. patent application Ser. No. 08/189,562, entitled "Electrostatic Chuck" by Shamouilian, et al., filed on Jan. 31, 1994—all of which are incorporated herein by reference.

To use the chuck, a substrate is placed on the chuck, and the insulated electrode on the chuck is electrically biased with respect to the substrate by a voltage applied via the electrical contact of the chuck. The applied voltage causes electrostatic charge to accumulate in the electrode of the chuck and in the substrate and the resultant electrostatic force holds the substrate to the chuck.

The insulator on the chuck typically comprises an insulative polymer, such as polyimide. The use of polymers to insulate the electrode of the chuck, limits the lifetime of the chuck in corrosive semiconductor fabrication processes, particular in processes which use oxygen containing gases and plasmas. Oxygen containing gases and plasmas are used for a variety of tasks, including etching of substrates, and cleaning of process chamber walls. These corrosive environments rapidly erode the polymeric insulator on the chuck.

Erosion of the insulator on the chuck results in failure of the chuck. Although a large portion of the insulator on the chuck is protected from the corrosive environments by the substrate held on the chuck, portions of the insulator which are exposed to the corrosive gases can erode in as few as a thousand process cycles. For example, when a substrate is electrostatically held on the chuck, the peripheral portion of the insulator is typically exposed to the corrosive environment in the process chamber. The corrosive gases in the chamber rapidly erode the exposed peripheral insulator portion. Erosion of the insulator at even a single point is sufficient to cause arcing of the electrode therein, requiring replacement of the entire chuck. Frequent replacement of the chuck is expensive and slows down the fabrication process. Also, if the chuck fails during processing of the substrate, the entire substrate can be lost, at a cost of several thousands of dollars.

Although alternative insulative materials, such as silicon oxide based insulators, can be used to protect the electrodes in oxygen containing processes, these materials have other inherent limitations. For example, silicon oxide based insulators rapidly erode in processes that use fluorine containing gases, such as fluorocarbon gases. Also, the silicon oxide based insulators are more difficult and expensive to manufacture.

Thus, it is desirable to have electrostatic chuck that is substantially resistant to erosion in corrosive gaseous environments containing gases. It is further desirable to have a chuck that can be inexpensively fabricated using conventional fabrication equipment.

SUMMARY

The electrostatic chuck of the present invention satisfies these needs. The electrostatic chuck comprises an insulator, the insulator including (i) an electrode therein, (ii) a central portion overlying the electrode, the central portion adapted to support a substrate thereon, and (iii) a peripheral portion extending beyond the electrode.

In one version of the invention, the central portion of the insulator is raised relative to the lower peripheral portion of the insulator. The raised central portion and lower peripheral portion define a step having a height H of less about 10 microns, and more preferably less than about 5 microns, to reduce erosion of the insulator.

In another version of the chuck, the peripheral portion of the insulator extends beyond the electrode and has a width W. The width W of the peripheral portion of the insulator is at least about 2 mm, and more preferably at least about 3 mm, to reduce erosion of the insulator.

DRAWINGS

These and other features, aspects and advantages of the present invention will become better understood with regard to the following description, appended claims, and accompanying drawings, where:

DESCRIPTION

Figure 2:
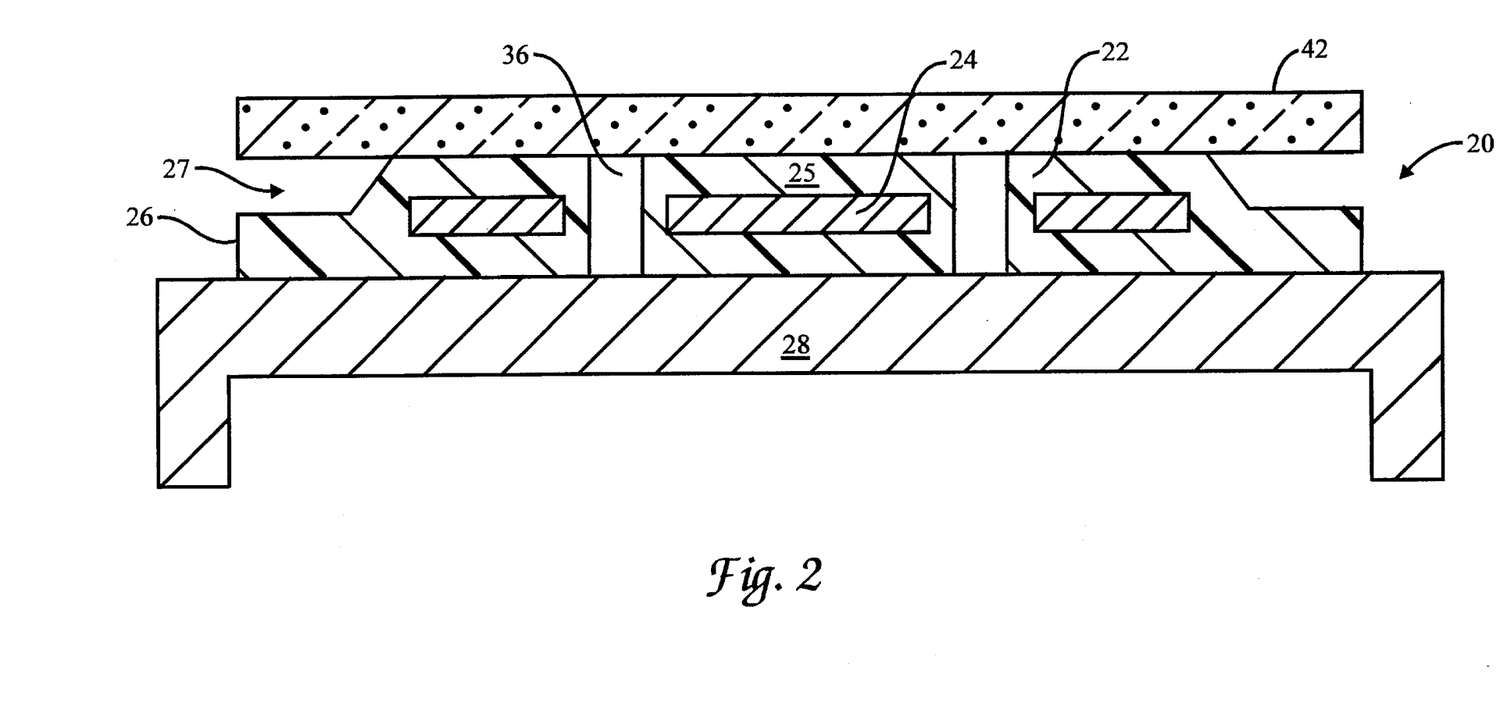
FIG. 2 is a cross-sectional, side elevational schematic view of a chuck of the present invention.
Figure 3:
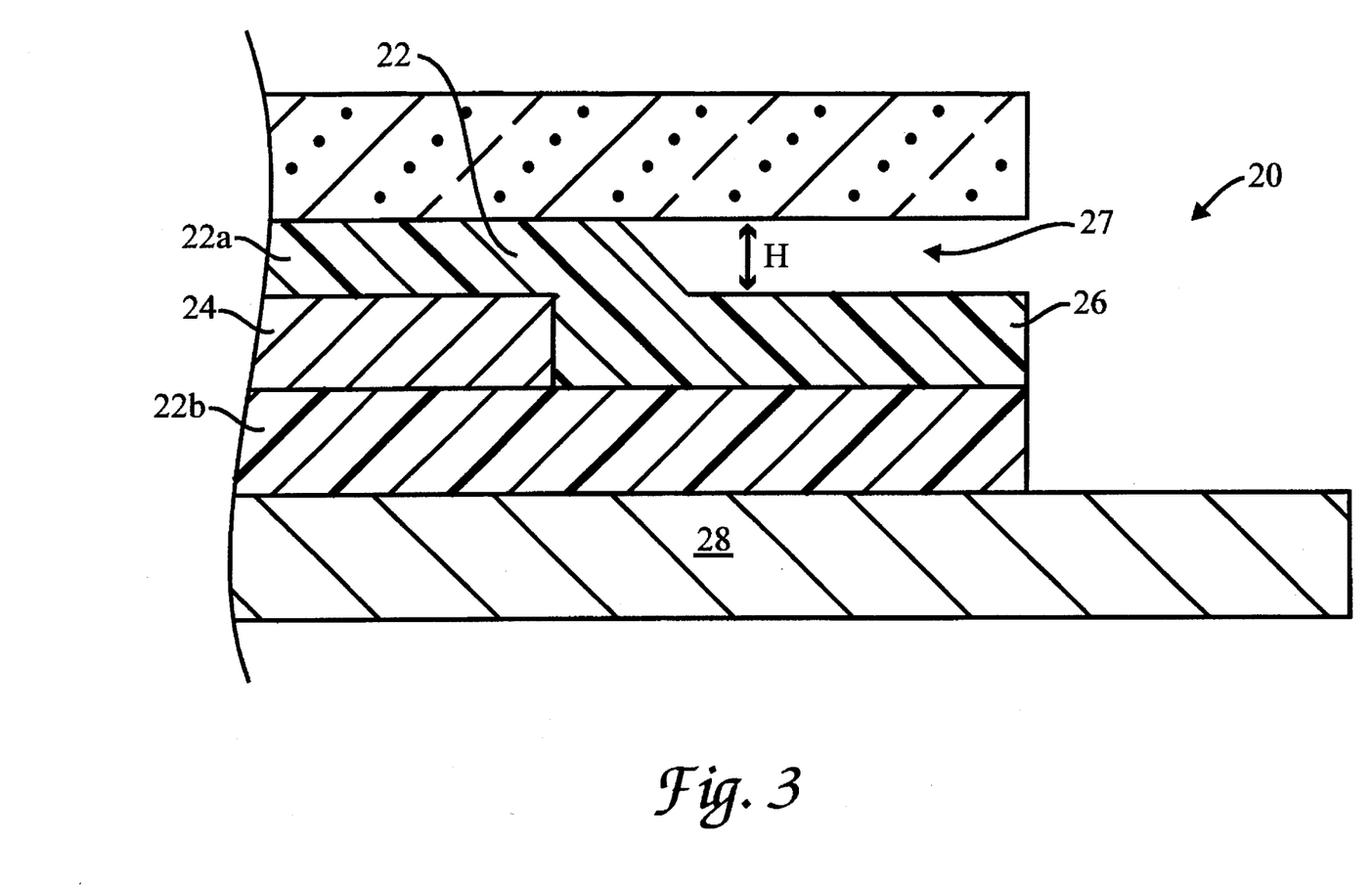
FIG. 3 is a partial sectional, side elevation, schematic view of the chuck of FIG. 2.
Figure 4:
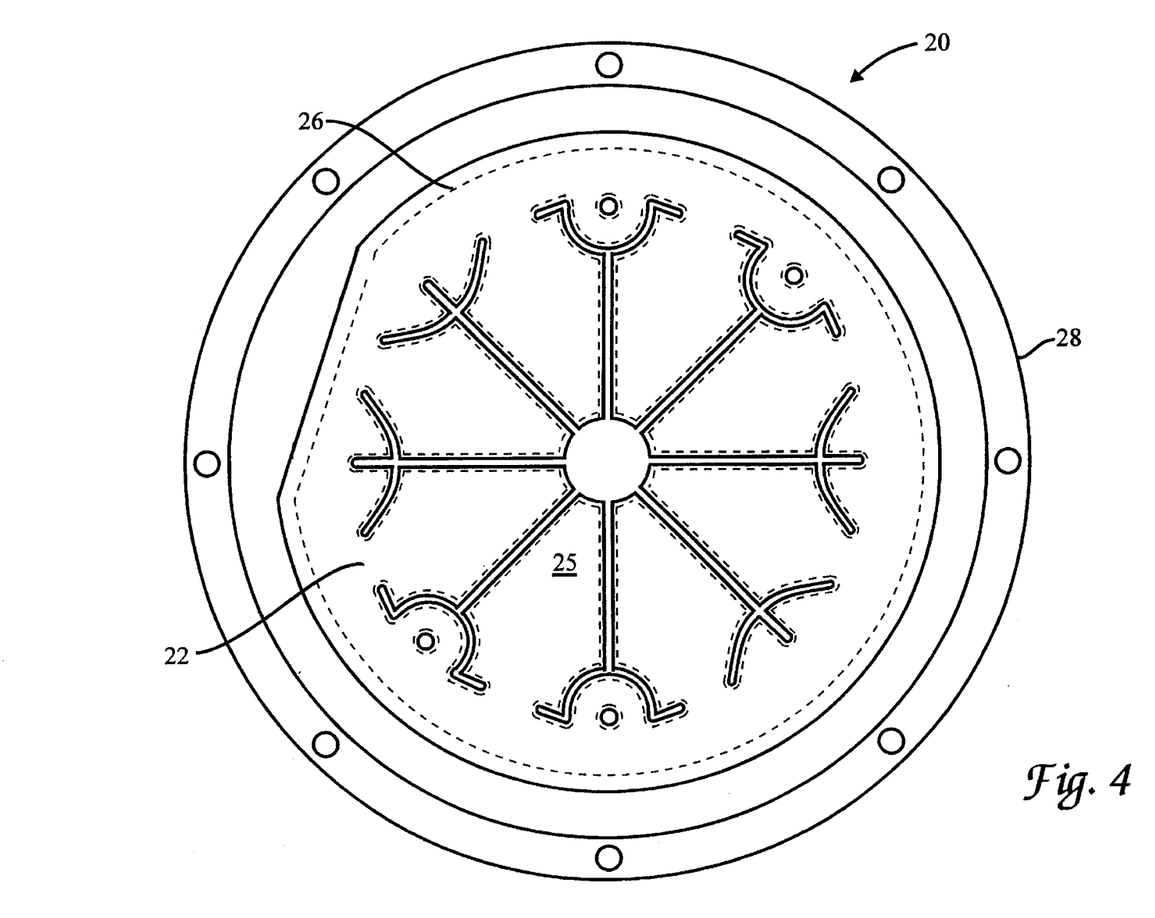
FIG. 4 is a top plan schematic view of the chuck of FIG. 2.
Figure 5:
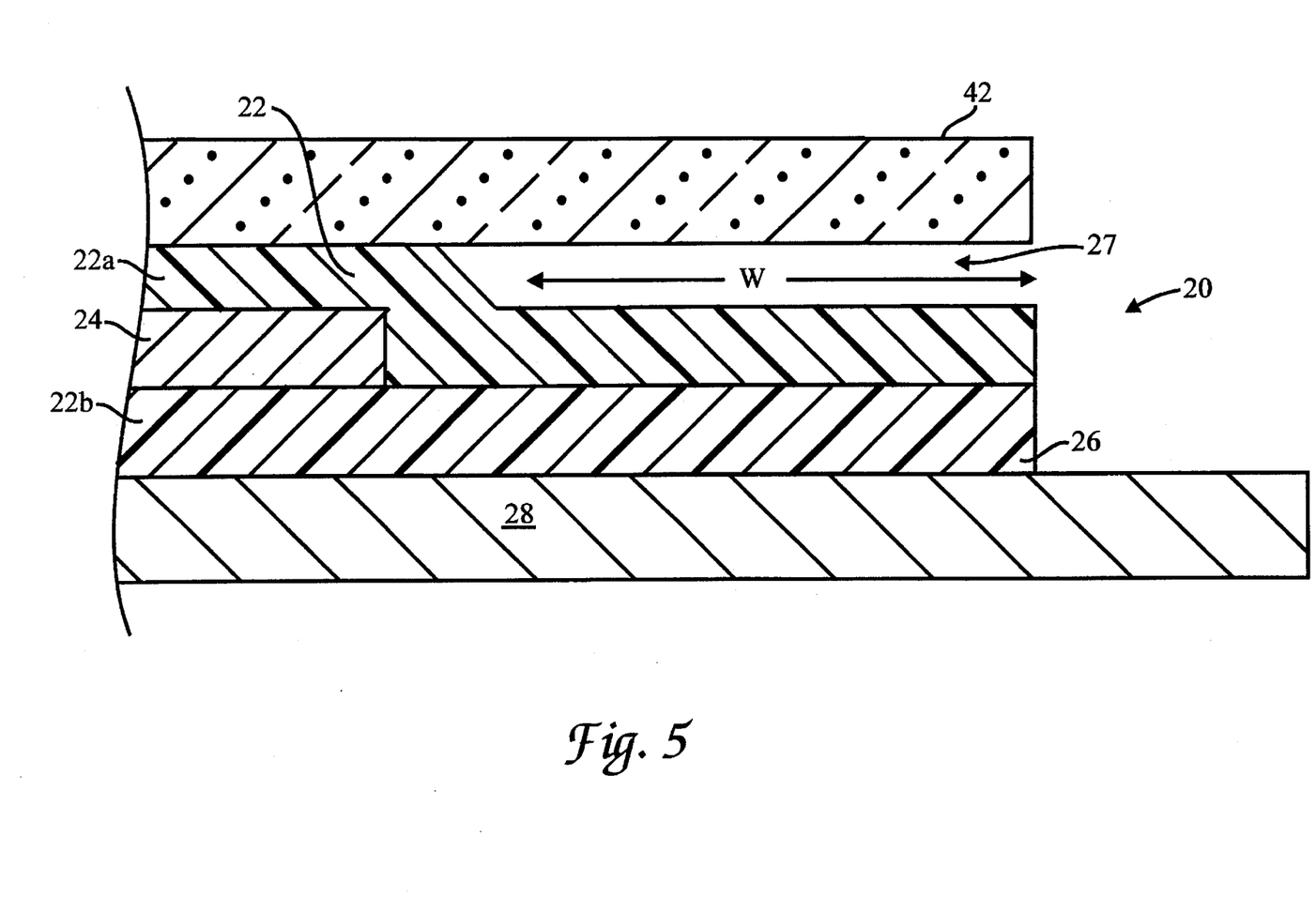
FIG. 5 is a partial sectional, side elevational schematic view of another version of the chuck of the present invention.

The electrostatic chuck 20 of the present invention generally comprises an insulator 22 with an electrode 24 therein, as shown in FIG. 2. A central portion 25 of the insulator overlies the electrode 24 and is adapted to support a substrate. A peripheral portion 26 of the insulator extends beyond the electrode 24. In one version of the chuck, as shown in FIG. 2, the central portion 25 of the insulator is raised relative to the peripheral portion 26 of the insulator which is lower, thereby defining a step 27 having a height H as shown in FIG. 3. The height H of the step 27 is less than about 10 microns, and more preferably about 5 microns, to reduce erosion of the insulator 22. In another version of the chuck 20, as shown in FIG. 5, the peripheral portion 26 of the insulator 22 that extends beyond the electrode 24, has a width W of at least about 2 mm, and more preferably at least about 3 mm to reduce erosion of the insulator 22.

Figure 1:
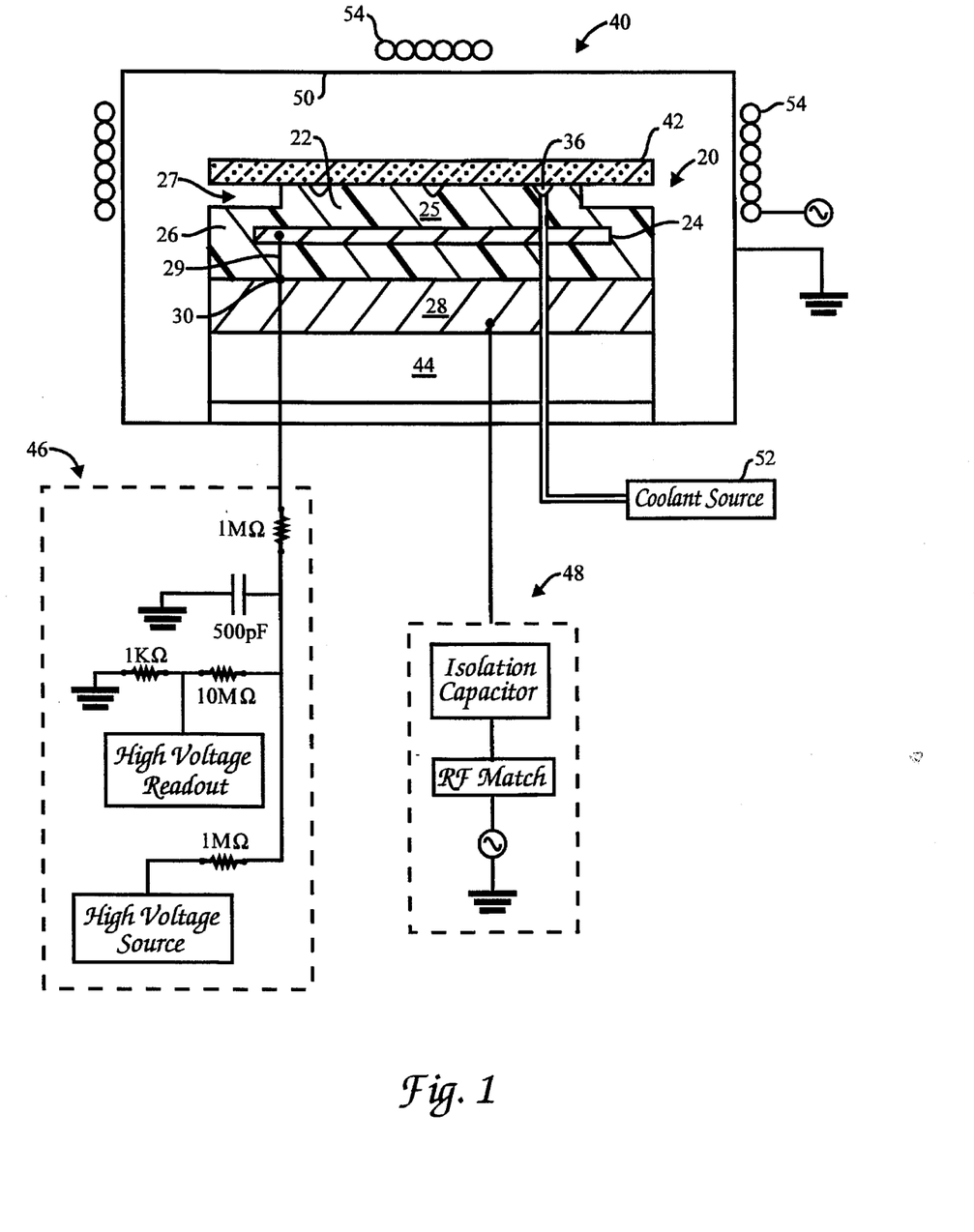
FIG. 1 is a cross-sectional, side elevational schematic view of a process chamber containing an electrostatic chuck of the present invention.

Typically, the insulator 22 with the electrode 24 therein, is on a base 28, which serves to support the insulator 22. An electrical connector 29 electrically connects the electrode 24 of the chuck 20 to an electrical contact 30 on the base of the chuck 20, as shown in FIG. 1. The chuck 20 can also have grooves 36 on the upper surface of the insulator 22 as shown in FIG. 1, or extending though the insulator 22, as shown in FIG. 2. The grooves 36 are provided for holding a coolant gas therein, for cooling a substrate held by the chuck.

With reference to FIG. 1, operation of the chuck 20 of the present invention will now be described. FIG. 1 shows a typical process chamber 40 containing a erosive gas used to process a substrate 42, such as a silicon wafer. The particular embodiment of the process chamber 40 shown herein is suitable for plasma processing of substrates 42, and is provided only to illustrate operation of the chuck 20, and should not be used to limit the scope of the invention.

The process chamber 40 generally comprises a support 44. The electrostatic chuck 20 is placed on the support 44, so that the electrical connector 30 of the chuck 20 electrically engages an external first voltage supply 46, which is provided for applying a voltage to the electrode 24 for operating the chuck 20. The first voltage supply 46 comprises a high voltage DC source of about 1000 to 3000 volts, connected to a high voltage readout, through a 10 MΩ resistor. The 1 MΩ resistor in the circuit limits the current flowing though the circuit, and a 500 pF capacitor is provided as an alternating current filter.

An external second voltage supply 48 is connected to the support 44 in the chamber. The support 44 functions as a process electrode for forming a plasma in the chamber 40. The second voltage supply 48 is provided for electrically biasing the support 44 with respect to an electrically grounded surface 50 in the chamber 40. The voltage supply 48 is conventional and generally comprises an RF impedance that matches the impedance of the process chamber 40 to the impedance of the line voltage, in series with an isolation capacitor, as shown in FIG. 1.

A coolant source 52 can be used to remove heat from the substrate 42, to maintain the substrate 42 at a constant temperature.

The process chamber 40 can also have cylindrical coils 54 wrapped around the chamber 40, for forming an inductive plasma or for generating a magnetic field in the chamber. During processing of the substrate 42, the magnetic field can provide more uniform plasma density thereby allowing more uniform processing of the substrate 42.

During its use, the chuck 20 is secured to the support 44 in the process chamber 40. The process chamber 40 is evacuated to a pressure ranging from about 1 to about 500 mTorr, and more typically from about 10 to about 100 mTorr. A substrate 42, such as a silicon or gallium arsenide wafer, is transferred from a load lock transfer chamber (not shown) to the chamber 40, and placed on the chuck 20. The electrode 24 in the chuck 20 is electrically biased with respect to the substrate 42 by the first voltage supply 46 so that electrostatic charge accumulates in the substrate 42 and in the electrode 24, causing the substrate to be electrostatically held to the chuck 20.

Process gas is introduced in the process chamber 40 using one or more sources of pressurized gas. For example, when the substrate 42 is being etched, conventional etchant gases, such as for example, $O_2$, $Cl_2$, $BCl_3$, $CCl_4$, $SiCl_4$, $CF_4$, $NF_3$, and mixtures thereof, are introduced into the chamber 40. Suitable etchant gases are generally described in S. Wolf and R. N. Tauber, *Silicon Processing for the VLSI Era,* Vol. I, Chap. 16: Dry Etching for VLSI, Lattice Press, Sunset Beach, Calif. (1986), which is incorporated herein by reference.

The voltage supply 48 is then activated to electrically bias the support 44 with respect to the grounded surface 50 in the chamber 40, thereby forming a plasma from the process gas in the chamber 40.

An alternating current can be applied through the coil 54 around the chamber 40 to form an inductive plasma, or to generate a magnetic field in the chamber 40 for enhancing the uniformity of the etching plasma in the chamber 40. The plasma activated etchant species impinge upon and etch the substrate 42.

During processing of the substrate 42, the corrosion resistance of the chuck 20 can be further enhanced by directing a non-reactive gas, such as inert gases, such as helium or oxygen, onto the peripheral portion of the insulator 22. Typically, the non-reactive gas is directed around the peripheral insulator portions using a circumferential manifold having a plurality of holes therein (not shown), as disclosed in U.S. patent application entitled, "Erosion Resistant Electrostatic chuck," Ser. No. 08/199,402, filed on Feb. 22, 1994, by Shamouilian, et al.

Particular aspects of the chuck 20 will now be discussed in detail.

Generally, the chuck 20 comprises an insulator 22 with an electrode 24 embedded therein. The insulator 22 has a central portion 25 overlying the electrode, and adapted to support a substrate. A peripheral portion 26 of the insulator extends beyond the electrode 24. In the version of the chuck shown in FIG. 2, the central portion 25 of the insulator 22 is raised relative to the peripheral portion 26 of the insulator which is lower, thereby defining a step 27 having a height H. When a substrate 42 is electrostatically held on the chuck 20, the raised central portion 25 of the insulator 26 is substantially covered by the substrate 42, and the lower peripheral portion 26 of the insulator 26 is exposed to the erosive environment in the process chamber 40. It has been discovered that failure of the chuck 20, often results from erosion of the exposed lower peripheral insulator portion 26 by the erosive gases in the process chamber 40.

The present invention provides novel and nonobvious solutions to the erosion problem. It has been discovered that reducing the height of the step 27 between the raised central portion 25 and lower peripheral portion 26 of the insulator 22 as shown in FIG. 3, can reduce erosion of the exposed peripheral portions of the insulator 22. Preferably, the height H of the step 27 is less than about 10 microns, and more preferably less than about 5 microns, and most preferably less than about 1 microns.

In the version of the chuck shown in FIG. 5, it has been discovered that maintaining the width W of the peripheral portion 26 of the insulator 22 to at least about 2 mm, and more preferably, at least about 3 mm, also reduces erosion of the chuck 20. The peripheral insulator portion 26 generally comprises an annular rim circumferentially disposed around electrode 24. Generally, the peripheral portion 26 of the insulator 22 is lower than the central portion 25 of the insulator 22, however, the peripheral portion 26 of the insulator 22 can also have the same height as the central portion 25 of the insulator 22.

INSULATOR

The insulator 22 of the chuck 20 typically comprises any insulative material, including polymers, and ceramic materials such as SiC, $SiO_2$, and $Si_3N_4$. Typically, the insulator 22 comprises a polymeric material, such as polyimide, polyketone, polyetherketone, polysulfone, polycarbonate, polystyrene, nylon, polyvinylchloride, polypropylene, polyetherketones, polyethersulfone, polyethylene terephthalate, fluoroethylene propylene copolymers, cellulose, triacetates, silicone, and rubber.

The insulator 22 is shaped and sized to enclose the electrode 24 therein, and is adapted to support a substrate thereon. The shape and size of the insulator 22, varies according to the size and shape of the substrate 42. For example, if the substrate 42 is disc-shaped, the insulator 22 is also disc-shaped. The overall thickness of the insulator 22 varies according to the electrical resistivity and dielectric constant of the insulative material used to form the insulator 22. When a polyimide is used as the insulator 22, the insulator has a dielectric breakdown strength of at least about 100 volts/mil (3.9 volts/micron), and more typically at least about 1000 volts/mil (39 volts/micron). Typically, the insulator 22 has a resistivity ranging from about $10^{13}$ Ω cm to $10^{20}$ Ω cm, and a dielectric constant of at least about 2, and more preferably at least about 3. When the insulator 22 has a dielectric constant of about 3.5, the entire insulator 22 is typically about 10 μm to about 500 μm thick, and more typically from about 100 μm to about 300 μm thick.

Preferably, the insulator 22 is resistant to temperatures in excess of 50° C., and more preferably resistant to temperatures in excess of 100° C., so that the chuck 20 can be used for processes where the substrate 42 is heated. Also, preferably, the insulator 22 has a high thermal conductivity so that heat generated in the substrate 42 during processing can dissipate through the chuck 20. The thermal conductivity of the insulator 22 should be at least about 0.10 Watts/m/°K, to allow sufficient heat transfer to preclude overheating of the substrate 42.

The insulator 22 can also include a high thermal conductivity filler material, such as diamond, alumina, zirconium boride, boron nitride, and aluminum nitride for increasing the thermal conductivity and resistance to plasma corrosion. Preferably the filler material is a powder with an average particle size of less than about 10 μm. Typically, the filler is dispersed in the insulative material in a volumetric ratio from about 10% to 80%, and more typically from about 20% to 50%.

Preferably, the insulator 22 has spaced apart grooves 36 therethrough, as shown in FIG. 2. The grooves 36 can also be on the insulator 22 as shown in FIG. 1. The grooves 36 are sized and distributed to hold coolant from a coolant source 52 for cooling the substrate 42. Typically, the grooves 36 form a pattern of intersecting channels, the channels lying between the features of the electrodes 24, as described below. Alternative groove patterns are described in aforementioned U.S. patent application Ser. No. 08/189,562.

Additionally, a protective coating (not shown) can be applied on the upper surface of the insulator 22 to protect the insulator 22 from chemical degradation when the chuck 20 is used in corrosive and erosive processing environments. Preferred protective coatings and processes for their fabrication are described in more detail in for example U.S. patent application Ser. No. 08/052,018, filed on Feb. 22, 1993, entitled "Protective Coating for Dielectric Material of Wafer Support Used in Integrated Circuit Processing Apparatus and Method of Forming the Same," by Wu, et al., which is incorporated herein by this reference.

ELECTRODE

The electrode 24 in the insulator 22 is made from any electrically conductive material, such as for example, copper, nickel, chromium, aluminum, iron, and alloys thereof. The shape and size of the electrode 24 varies according to the size and shape of the substrate 42. For example, if the substrate 42 is disc-shaped, the electrode 24, is also disc-shaped to maximize the area of the electrode in contact with the substrate 42.

The electrode 24 be continuous as shown in FIG. 1, or can be patterned as shown in FIG. 2. Preferably, the electrode 24, is patterned into one of several alternative configurations. In one patterned configuration, the electrode 24 forms interconnected features, the features sized so that the grooves 36 can be formed between the electrode features, the grooves 36 provided for holding a coolant therein for cooling the substrate 42.

In another configuration, the patterned electrode 24 comprises at least one pair of electrodes, so that the electrode 24 can function as a bipolar electrode. Suitable bipolar electrode configurations are disclosed in U.S. Pat. Nos. 4,184,188 to Briglia; 4,384,918 to Abe; and Tsukada et al.,—all of which are incorporated herein by reference. When a bipolar electrode 24 configuration is used, voltages are applied to each of the pair of electrodes, to maintain the pair of electrodes at opposite polarities. The bipolar electrode configurations allows accumulation of electrostatic charge in the substrate 42, without electrically biasing the substrate. Bipolar electrode configurations can be advantageous when the chuck 20 is used for non-plasma processes, where there are no charged plasmas species that serve as change carriers for electrically biasing the substrate 42.

BASE

The base 28 of the chuck is provided for supporting the insulator 22 with the electrode 24 therein. Generally, the base 28 has a shape and size corresponding to the shape and size of the substrate 42 to maximize heat transfer between the base 28 and the substrate 42, and to provide a wide surface for holding the substrate 42. For example, if the substrate 42 is disk shaped, a right cylindrical base is preferred. Alternatively, the base 28 can have a shape different from the shape of the substrate 42 or a size different from the size of the substrate 42. Typically, the base is a right cylinder of aluminum, having a diameter of about 100 mm to 225 mm (4 to 9 inches), and a thickness of about 1.5 to 2 cm.

METHOD OF MANUFACTURE

A preferred process for making an electrostatic chuck 20 according to the present invention, is described below.

The base 28 of the chuck 20 is typically machined from an aluminum plate, cut into a right-cylindrical shape with a thickness of about 1.5 to 1.8 cm and a diameter of about 100 to 300 mm, to match the diameter of the substrate which typically ranges from about 127 to about 203 mm (5–8 inches). The top and bottom surfaces of the aluminum plate are ground using conventional aluminum grinding techniques, until the surface roughness of the plate is less than about 1 micron. Surface grinding of the plate is essential for the base to uniformly contact the support 44, and the substrate placed on the base 28, to allow for efficient thermal transfer between the substrate 42 and the support 44. After grinding, the plate is thoroughly cleaned to remove grinding debris.

Figure 6:
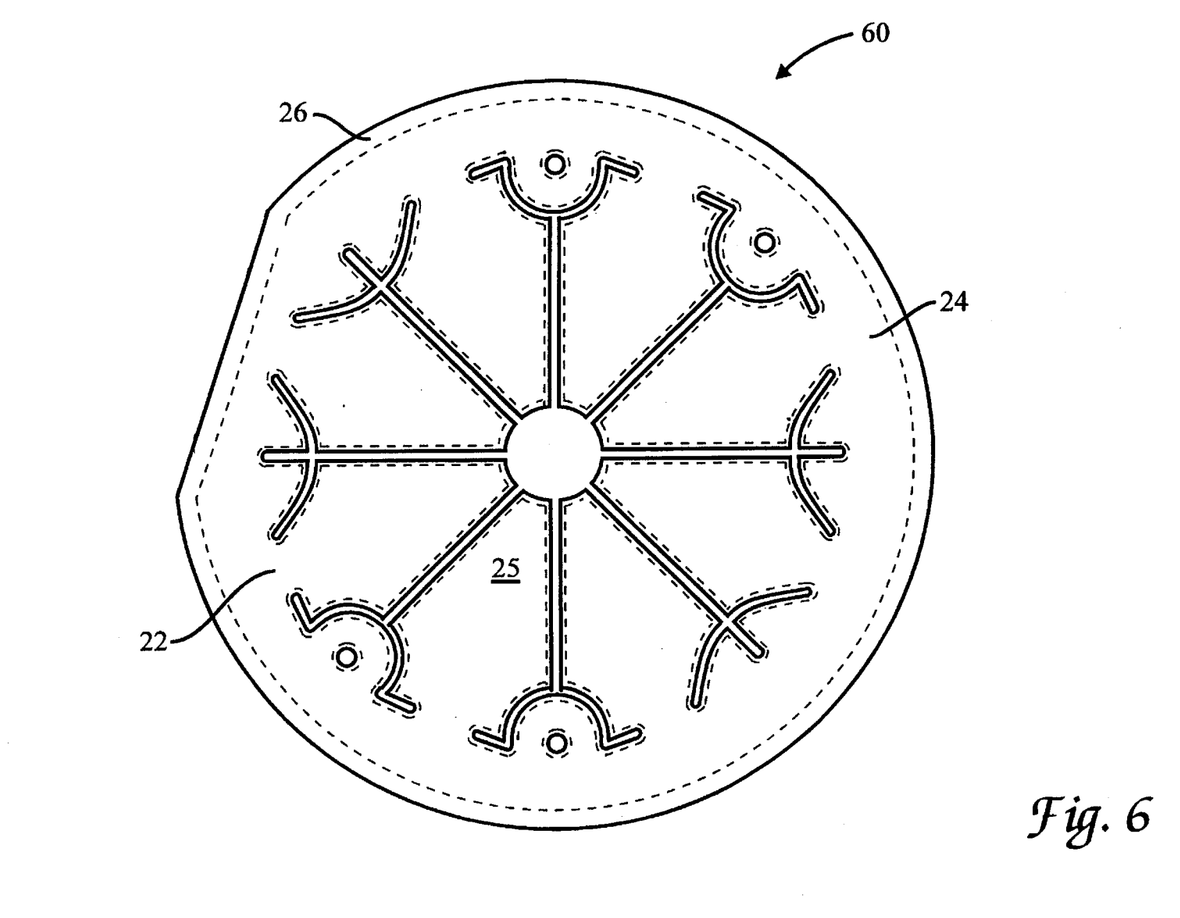
FIG. 6 is a top plan view of a partially fabricated chuck of the present invention, showing the insulator with the electrode therein.

Typically, the insulator 22 is fabricated as a laminate 60, as shown in FIG. 6, comprising two insulative layers 22a, 22b, as shown in FIGS. 2 and 5, with the electrode 24 enclosed therebetween. The upper insulative layer 22a overlying the electrode 24, forms the central portion 25 of the insulator 22. The lower insulative layer 22b is below the electrode 24. The upper and lower layers 22a, 22b, extend beyond the electrode to form the peripheral portion 26 of the insulator 22. When the central portion 25 is raised relative to the peripheral portion 26, a step 27 having a height H is formed in the insulator. The peripheral portion of the insulator 26 extends beyond the electrode 24 and has a width W.

A preferred method of forming the laminate member 60 will now be described. In this method, an electrically insulative polymer film is selected to form the lower insulative layer 22b. Suitable insulative films include, "KAPTON", a polyamide film manufactured by DuPont de Nemours Co., in Wilmington, Del.; "APIQUEO" fabricated by Kanegafuchi Chemical Indus., Japan; "UPILEX" manufactured by Ube Indus. Ltd., Japan; "NITOMID" fabricated by Nitto Electric Indus. Co. Ltd., Japan; and "SUPERIOR FILM" fabricated by Mitsubishi Plastics Indus. Ltd., Japan.

Thereafter, the electrode 24 is formed on the lower insulative layer 22b by physical vapor deposition methods such as sputtering, chemical vapor deposition, or electroplating. For example, any conventional sputtering method can be used to form the electrode 24. Suitable sputtering techniques are generally disclosed in S. Wolf and R. N. Tauber, *Silicon Processing for the VLSI Era*, Vol. I, Lattice Press, Sunset Beach, Calif. (1986), which is incorporated herein by reference.

A second insulative film 22a is then applied over the electrode 24, in the form of a sheet of insulative material (as described above), or by spraying, dipping, painting, spin coating, or silk screening an electrically insulative polymer over the electrode 24.

An electrical connector 29 is then affixed to the electrode 24 using electrically conductive adhesive. The electrical connector 29 is adhered to the base 28, using conventional temperature and pressure based adhesives. The laminate member 60 is then adhered to the base 28 using conventional pressure or temperature sensitive adhesives, such as polyimides, to form the chuck 20.

In the laminate 60, the upper insulative laminate layer 22a overlying the electrode 24, forms the raised central portion 25 of the insulator 22. In the version of the chuck 20 shown in FIG. 2, the height H of the step 27 between the raised central portion 25 and lower peripheral portion 26 of the insulator 22, is reduced to less than about 10 microns, by one of several different methods. A preferred method of reducing the height H of the step 27 in the insulator comprises forming a thin electrode layer 24, having a thickness of from about 1 μm to 10 μm, and more preferably from about 1 μm to 5 μm, on the lower insulative layer 22b. The thin electrode layer 24 lowers the height H of the step 27 by lowering the height of the raised central insulator portion 25 overlying the electrode 24. In this version, the electrode 24 typically has a diameter of from about 180 mm to 200 mm, and more typically about 190 to 195 mm.

The chuck 20 of FIG. 2 can also be fabricated by increasing the thickness of the peripheral portion 26 of the insulator 22 thereby reducing the height H of the step 27. The thickness of the peripheral insulator portion 26 can be increased by applying an additional layer of insulator on the peripheral insulator portion 26. For example, the additional insulator layer can comprise a precut annular sheet of polymeric insulator which is adhered on the peripheral portion 26 of the insulator 22. Alternatively, the additional insulator layer can also be applied in the form of liquid insulative material by painting or dipping. Another method comprises depositing, by physical or chemical vapor deposition methods, a layer of insulator, such as SiC or $SiO_2$, on the peripheral portion 26 of the insulator 22.

In the version of the chuck 20 of FIG. 5, erosion of the chuck 20 is reduced by increasing the width W of the peripheral portion 26 of the insulator 22. The upper and lower laminate layers 22a, 22b, extend beyond the electrode to form the lower peripheral portion 26 of the insulator 22, which has a width W. The peripheral insulator portion 26 generally comprises an annular rim having a width W, circumferentially disposed around the electrode 24. The width W of the peripheral portion 26 of the insulator 22 is maintained at least about 2 mm, and more preferably, at least about 3 mm, to reduce erosion of the insulator 22. The width W of the peripheral insulator portion 26 can be increased by maintaining the diameter of the electrode 24 to less than about 190 mm, and more preferably, less than about 188 mm.

Alternative methods of forming the chuck 20, will now be described. Preferably, the chuck 20 comprises a patterned electrode 24. The patterned electrode 24 is formed by (ii) forming a patterned resist layer on a continuous electrode layer, using the conventional photoresist techniques; and (iii) etching the portions of the electrode layer which are exposed, by a wet chemical or plasma activated etching process. The resist layer can be formed by applying photoresist, such as "RISTON" fabricated by DuPont de Nemours Chemical Co., Wilmington, Del., on the electrode layer. Conventional photolithographic methods, such as those described in U.S. Pat. No. 4,952,528, to Abe, et al., U.S. Pat. No. 5,079,600, to Schnur, et al., U.S. Pat. No. 5,221,422, to Das, et al. all of which are incorporated herein by this reference, are then used to pattern the resist layer. After forming the resist layer, the electrode layer 24 can be etched using a wet chemical etching method, such as by immersing the multilayer film into an etchant such as ferric chloride, sodium persulfate, or an acid or base. Alternatively, a plasma etching techniques, can also be used to etch the electrode 24 such as those techniques generally disclosed in U.S. Pat. Nos. 3,615,951 to Franco, et al; 5,100,499 to Douglas; 5,167,748, to Hall et al; 5,185,058 to Cathey; 5,200,032, to Shinohara; 5,215,619 to Cheng, et al; and 5,221,430 to Kadomura, et al., all of which are incorporated herein by this reference.

After forming the etched electrode layer, a second insulative film 22a is applied over the etched electrode 24 as described above. The resultant laminate can be then punched, stamped or pressed to form grooves 36 through the insulator 22. When a liquid polymeric layer is applied over the etched electrode 24, the viscous liquid polymer can flow into the trenches between the patterned electrode 24 forming the grooves 36 on the upper surface of the insulator 22.

Instead of sputtering the electrode layer onto the lower insulative layer 22b, an alternative method of forming the electrode 24 comprises a multi-step electroplating process which includes the steps of: (i) sputter depositing a "seed" chromium layer onto the insulative layer, and (ii) electroplating metal onto the chromium seed layer portions which are not coated by resist to form the electrode and integral electrical connector. Conventional chromium sputtering techniques are suitable, such as for example disclosed in U.S. Pat. No. 4,131,530; U.S. Pat. No. 4,022,947; U.S. Pat. No. 4,392,992; and J. A. Thorton, "Sputter Deposition Onto Plastics," Proceedings 18th American Conference of Society of Vacuum Coaters, Key Biscayne, Fla., April 7–9 (1975), pages 8–26—all of which are incorporated herein by reference. Conventional copper plating techniques are used to form the electrode 24, such as those disclosed in U.S. Pat. No. 5,252,196, to Sonnenberg, et al.; U.S. Pat. No. 5,004,525, to Bernards, et al.; U.S. Pat. No. 4,898,647, to Luce, et al.; and U.S. Pat. No. 4,948,474, to Miljkovic—all of which are incorporated herein by reference.

Another method of forming the laminate 60 comprising an insulator 22 with an electrode 24 therein, uses a multilayer film comprising an insulative layer and an electrically conductive electrode layer. A suitable multilayer film comprises "R/FLEX 1100" film fabricated by Rogers Corporation, Chandler, Ariz., which comprises an electrically conductive copper layer on a 25 to 125 µm thick polyimide insulator layer. The copper layer of the multi-layer film is etched, routed, or milled to obtain an electrode 24 having the desired thickness and configuration. Conventional wet or dry chemical etching methods can be used to etch the electrode layer of the multilayer film, as described above. After forming the electrode layer, a second insulative film, is adhered over the electrode layer to form the laminate 60.

EXAMPLE 1

This experiment was conducted to compare the erosion performance of a conventional prior art electrostatic chuck with that of a chuck 20 of the present invention.

The prior art chuck had an electrode having a thickness of 37 microns. The step in the peripheral portion of the insulator of the chuck had a height H of about 50 microns.

The chuck 20 of the present invention had an electrode thickness of about 5 microns. The step 27 in the peripheral portion 26 of the insulator 22 on the chuck had a height H of less than 10 microns, The prior art chuck and the chuck 20 of the present invention, were each secured to a support 44 in process chamber 40 of "PRECISION 5000" etching apparatus, commercially available from Applied Materials, Santa Clara, Calif. The process chamber 40 was evacuated to a pressure ranging from about 1 to about 500 mTorr, and more typically from about 10 to about 100 mTorr. A silicon wafer substrate 42 was transferred to the chamber 40 from a load lock transfer chamber (not shown), and electrostatically held on the chuck.

Etchant process gas was introduced in the process chamber 40 using one or more sources of pressurized gas. Etching processes comprising multiple steps were then performed on the substrate 42. In the first step of the etching process, the etchant gas comprised HBr and $NF_3$, in the next step the gases comprised HBr, $He/O_2$, and $NF_3$, and in the final step, only $NF_3$ etchant gas was used. In each step, the voltage supply 48 was activated to electrically bias the support 44 with respect to the grounded surface 50, thereby forming a plasma from the process gas in the chamber 40. The plasma activated etchant species impinged upon and etched the substrate 42.

It was found that the prior art chuck failed after 4 hours of processing, whereas the chuck 20 of the present invention lasted 30 hours without failing. This presents a seven-fold increase in the useful life of the chuck 20, a significant improvement over prior art chucks.

Although the present invention has been described in considerable detail with reference to certain preferred versions, many other versions should be apparent to those skilled in the art. For example, the step in the insulator of the chuck can be entirely removed. Therefore, the spirit and scope of the appended claims should not be limited to the description of the preferred versions contained herein.

What is claimed is:

1. An electrostatic chuck having reduced erosion for holding a substrate in a process chamber containing erosive gas, the chuck comprising:

an insulator comprising (i) an electrode therein, (ii) a raised central insulator portion overlying the electrode, the raised portion adapted to support a substrate thereon, and (iii) a lower peripheral insulator portion extending beyond the electrode, the raised central insulator portion and the lower insulator portion defining a step having a height H, wherein when a substrate is electrostatically held on the chuck, the raised central insulator portion is substantially covered by the substrate, and the lower peripheral insulator portion is exposed to the erosive gas in the process chamber, and wherein the height H of the step is less than about 10 microns and sized sufficiently small to reduce erosion of the exposed lower peripheral insulator portion.

2. The electrostatic chuck of claim 1, wherein the height H of the step is less than about 5 microns.

3. The electrostatic chuck of claim 2, wherein the height H of the step is less than about 1 micron.

4. The electrostatic chuck of claim 1, wherein the lower peripheral insulator portion comprises a substantially annular rim having a width W.

5. The electrostatic chuck of claim 4, wherein the width W of the annular peripheral insulator portion is at least about 2 min.

6. The electrostatic chuck of claim 5, wherein the width W of the annular peripheral insulator portion is at least about 3 mm.

7. The electrostatic chuck of claim 1, wherein the insulator is on a base.

8. The electrostatic chuck of claim 1, wherein the insulator has a right cylindrical shape.

9. An electrostatic chuck having reduced erosion for holding a substrate in a process chamber containing erosive gas, the chuck comprising:

an insulator comprising (i) an electrode therein, (ii) a raised central portion overlying the electrode, the raised central portion adapted to support a substrate thereon, and (iii) a lower peripheral portion extending beyond the electrode, the lower peripheral portion having a width W, wherein when a substrate is electrostatically held on the chuck, the raised central portion of the insulator is substantially covered by the substrate, and the lower peripheral insulator portion is exposed to the erosive gas in the process chamber, and wherein the width W of the lower peripheral portion is at least about 2 mm, and sized sufficiently large to reduce erosion of the peripheral portion of the insulator.

10. The electrostatic chuck of claim 9, wherein the width W of the peripheral insulator portion is at least about 3 mm.

11. The electrostatic chuck of claim 9, wherein the insulator has a right cylindrical shape.

12. An electrostatic chuck assembly having reduced erosion for holding a substrate in a process chamber containing erosive gas, the assembly comprising:

(a) an electrostatic chuck comprising
(i) a base; and
(ii) an insulator on the base, the insulator comprising (1) an electrode therein, (2) a raised central insulator portion overlying the electrode and adapted to support a substrate thereon, and (3) a lower peripheral insulator portion extending beyond the electrode, the raised central insulator portion and the lower peripheral insulator portion defining a step having a height H; and (b) a substrate electrostatically held on the chuck, the raised central insulator portion being substantially covered by the substrate, and the lower peripheral insulator portion being exposed to the erosive gas in the process chamber, wherein the height H of the step in the insulator is less than about 10 microns and sized sufficiently small to reduce exposure of the lower peripheral insulator portion to the erosive gas thereby reducing erosion of the insulator.

13. A process chamber comprising the electrostatic chuck assembly of claim 12.

14. An electrostatic chuck assembly having reduced erosion for holding a substrate in a process chamber containing erosive gas, the assembly comprising:

(a) an electrostatic chuck comprising
 (i) a base; and
 (ii) an insulator on the base, the insulator comprising (1) an electrode therein, (2) a raised central portion overlying the electrode and adapted to support a substrate thereon, and (3) a lower peripheral portion extending beyond the electrode, the lower peripheral portion having a width W; and (b) a substrate electrostatically held on the chuck, the raised central portion of the insulator being substantially covered by the substrate, and the lower peripheral portion of the insulator being exposed to the erosive gas in the process chamber, wherein the width W of the lower peripheral portion of the insulator is at least about 2 mm, and sized sufficiently large to reduce erosion of the insulator.

15. A process chamber comprising the electrostatic chuck assembly of claim 14.

* * * * *